(12) United States Patent
Lee et al.

(10) Patent No.: US 9,753,201 B2
(45) Date of Patent: Sep. 5, 2017

(54) WIRE GRID POLARIZER AND METHOD OF FABRICATING THE SAME

(71) Applicant: Samsung Display Co. Ltd., Yongin, Gyeonggi-Do (KR)

(72) Inventors: Su Mi Lee, Hwaseong-si (KR); Min Hyuck Kang, Seoul (KR)

(73) Assignee: Samsung Display Co., Ltd. (KR)

( * ) Notice: Subject to any disclaimer, the term of this patent is extended or adjusted under 35 U.S.C. 154(b) by 275 days.

(21) Appl. No.: 14/668,617

(22) Filed: Mar. 25, 2015

(65) Prior Publication Data

US 2016/0131811 A1    May 12, 2016

(30) Foreign Application Priority Data

Nov. 11, 2014    (KR) ........................ 10-2014-0156195

(51) Int. Cl.
  *G02B 5/30*    (2006.01)
  *G03F 7/00*    (2006.01)
  *B82Y 40/00*   (2011.01)

(52) U.S. Cl.
  CPC ............ *G02B 5/3058* (2013.01); *B82Y 40/00* (2013.01); *G03F 7/0002* (2013.01); *G03F 7/0005* (2013.01)

(58) Field of Classification Search
  CPC ... G02B 5/3058; G03F 7/0002; G03F 7/0005; B82Y 40/00
  USPC ....................................................... 430/321
  See application file for complete search history.

(56) References Cited

U.S. PATENT DOCUMENTS

| 7,842,337 B2 | 11/2010 | Kim et al. |
| 7,964,107 B2 | 6/2011 | Millward |

(Continued)

FOREIGN PATENT DOCUMENTS

| KR | 1020080024316 A | 3/2008 |
| KR | 1020100068417 A | 6/2010 |

(Continued)

OTHER PUBLICATIONS

Cheng, "Dense Self-Assembly on Sparse Chemical Patterns: Rectifying and Multiplying Lithographic Patterns Using Block Copolymers**", DOI 10.1002/adma.200800826, Advanced Materials, pp. 3155-3158, 2008.

(Continued)

*Primary Examiner* — John A McPherson
(74) *Attorney, Agent, or Firm* — Innovation Counsel LLP

(57) ABSTRACT

Provided is a method of fabricating a wire grid polarizer, the method comprising an organic light-emitting display panel. According to an aspect of the present disclosure, there is provided a method comprising sequentially stacking a conductive wire pattern layer, a first neutral layer, a guide pattern layer and a second neutral layer on a substrate, forming etch-stop patterns on the second neutral layer, forming second neutral layer patterns and guide patterns by patterning the second neutral layer and the guide pattern layer using the etch-stop patterns, coating a block copolymer of two types of monomer blocks having different etch rates on the first neutral layer and the second neutral layer patterns, aligning the block copolymer, removing one type of monomer blocks from the aligned block copolymer, and patterning the conductive wire pattern layer using the remaining monomer blocks, the second neutral layer patterns, and the guide patterns.

12 Claims, 19 Drawing Sheets

(56) References Cited

U.S. PATENT DOCUMENTS

| | | | |
|---|---|---|---|
| 2008/0037101 A1 | 2/2008 | Jagannathan et al. | |
| 2010/0151393 A1* | 6/2010 | Kim | B81C 1/00031 430/322 |
| 2012/0080404 A1* | 4/2012 | Lee | B81C 1/00031 216/37 |
| 2014/0144875 A1* | 5/2014 | Lim | G02B 5/3058 216/24 |
| 2014/0346139 A1* | 11/2014 | Kim | G02B 5/3058 216/24 |

FOREIGN PATENT DOCUMENTS

| | | |
|---|---|---|
| KR | 1020130034778 A | 4/2013 |
| KR | 1020140030873 A | 3/2014 |
| KR | 1020140091316 A | 7/2014 |

OTHER PUBLICATIONS

Cheng, "Simple and Versatile Methods to Integrate Directed Self-Assembly with Optical Lithography Using a Polarity-Switched Photoresist", ACSNANO, www.acsnano.org, vol. 4, No. 8, pp. 4815-4823, 2010.

Jeong, "Ultralarge-Area Block Coploymer Lithography Enabled by Disposable Photoresist Prepatterning", ACSNANO, www.acsnano.org, vol. 4, No. 9, pp. 5181-5186, 2010.

Jeong, "Soft Graphoepitaxy of Block Copolymer Assembly with Disposable Photoresist Confinement", Nano Letters, vol. 9, No. 6, pp. 2300-2305, 2009.

Jung, "Three-Dimensional Multilayered Nanostructures with Controlled Orientation of Microdomains from Cross-Linkable Block Copolymers", ACSNANO, www.acsnano.org, vol. 5, No. 8, pp. 6164-6173, 2011.

* cited by examiner

WIRE GRID POLARIZER AND METHOD OF FABRICATING THE SAME

This application claims priority from Korean Patent Application No. 10-2014-0156195 filed on Nov. 11, 2014 in the Korean Intellectual Property Office, the disclosure of which is incorporated herein by reference in its entirety.

BACKGROUND

1. Related Field

The present disclosure relates to a wire grid polarizer and a method of fabricating the same.

2. Description of the Related Art

A wire grid polarizer is an array of conductive wires arranged in parallel such that it polarizes incident light. That is, the wire grid polarizer transmits light having a specific polarization.

If the wire grid polarizer has a structure in which the distance between the conductive wires is shorter than the wavelength of incident light, the wire grid polarizer reflects portions of the incident light that have a polarization parallel to the wires and transmits portions of the incident light that have a polarization perpendicular to the wires. Thus, the wire grid polarizer allows reuse of the reflected polarized light, unlike an absorptive polarizer.

SUMMARY

Aspects of the present disclosure provide a method of fabricating uniform wire grid patterns, a wire grid polarizer fabricated using the method, and a display device including the wire grid polarizer.

However, aspects of the present disclosure are not restricted to disclosed herein. The above and other aspects of the present disclosure will become more apparent to one of ordinary skill in the art to which the present disclosure pertains by referencing the detailed description of the present disclosure given below.

According to an aspect of the present disclosure, there is provided a method of fabricating a wire grid polarizer, the method comprising sequentially stacking a conductive wire pattern layer, a first neutral layer, a guide pattern layer and a second neutral layer on a substrate, forming etch-stop patterns on the second neutral layer, forming second neutral layer patterns and guide patterns by patterning the second neutral layer and the guide pattern layer using the etch-stop patterns, coating a block copolymer of two types of monomer blocks having different etch rates on the first neutral layer and the second neutral layer patterns, aligning the block copolymer, removing one type of monomer blocks from the aligned block copolymer, and patterning the conductive wire pattern layer using the remaining monomer blocks, the second neutral layer patterns, and the guide patterns.

According to another aspect of the present disclosure, there is provided a method of fabricating a wire grid polarizer, the method comprising sequentially stacking a conductive wire pattern layer and a guide pattern layer on a substrate, forming guide patterns by patterning the guide pattern layer, forming a neutral layer on the guide patterns and the conductive wire pattern layer, coating a block copolymer of two types of monomer blocks having different etch rates on the neutral layer, aligning the block copolymer, removing one type of monomer blocks from the aligned block copolymer, and patterning the conductive wire pattern layer using the remaining monomer blocks, the neutral layer, and the guide patterns.

According to still another aspect of the present disclosure, there is provided a wire grid polarizer comprising a substrate, a plurality of parallel conductive wire patterns protruding from the substrate, and a plurality of neutral layer patterns located on one or more of the conductive wire patterns.

BRIEF DESCRIPTION OF THE DRAWINGS

The above and other aspects and features of the present disclosure will become more apparent when the detailed description of exemplary embodiments provided below is considered in conjunction with the following drawings, in which.

DETAILED DESCRIPTION

Figure 1:
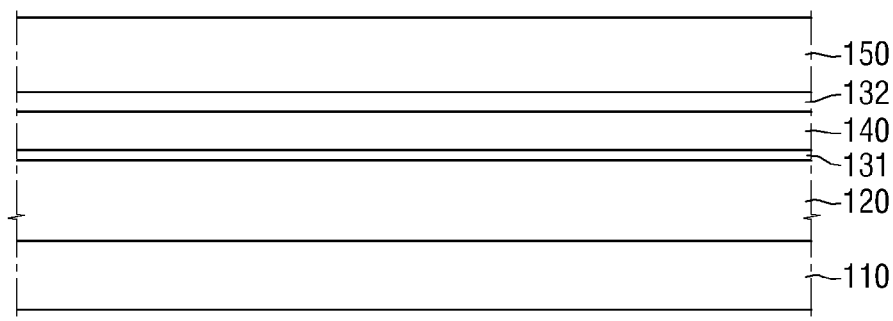
FIGS. 1, 2, 3, 4, 5, 6 and 7 are cross-sectional views illustrating the steps of a process of fabricating a wire grid polarizer according to an embodiment of the present system and method.

The aspects and features of the present system and method will be apparent by referring to the embodiments provided herein with reference to the accompanying drawings. However, the present system and method are not limited to the embodiments disclosed hereinafter, but can be implemented in diverse forms. The matters defined in the description, such as the detailed construction and elements, are provided to assist those of ordinary skill in the art in understanding the present system and method, and therefore, are not limiting of the present system and method. The same reference numerals are used herein to describe the same elements across various figures. In the drawings, the sizes and relative sizes of the layers and areas may be exaggerated for clarity.

The term "on" that is used to designate that an element is on another element or a layer includes both a case in which the element is located directly on the other element or layer and a case in which the element is located on the other element with an intervening element or layer in between the element and the other element.

Although the terms "first, second, and so forth" are used to describe diverse constituent elements, such constituent elements are not limited by the terms. The terms are used only to distinguish a constituent element from another constituent element. Accordingly, in the following description, a first constituent element may also be referred to as a second constituent element.

Exemplary embodiments are described hereinafter with reference to the accompanying drawings.

FIGS. 1 through 7 are cross-sectional views illustrating the steps of a process of fabricating a wire grid polarizer according to an embodiment of the present system and method.

Referring to FIG. 1, a conductive wire pattern layer 120, a first neutral layer 131, a guide pattern layer 140, a second neutral layer 132, and an etch-stop layer 150 may be sequentially stacked on a substrate 110.

The substrate 110 may be made of a material that transmits visible light. The material that forms the substrate 110 may be selected according to use or process. Examples of the material may include various polymers such as, but not limited to, glass, quartz, acrylic, triacetylcellulose (TAC), cyclic olefin copolymer (COP), cyclic olefin polymer (COC), polycarbonate (PC), polyethylene naphthalate (PET), polyimide (PI), polyethylene naphthalate (PEN), polyether sulfone (PES), and polyarylate (PAR). The substrate 110 may be made of a flexible, optical film material.

The conductive wire pattern layer 120 may be made of a conductive material. In an exemplary embodiment, the conductive wire pattern layer 120 may be made of a metal material, such as one selected from the group consisting of, but not limited to, aluminum (Al), chrome (Cr), silver (Ag), copper (Cu), nickel (Ni), titanium (Ti), cobalt (Co), molybdenum (Mo), or an alloy of these metals.

In some cases, the conductive wire pattern layer 120 may include two or more layers. For example, a first conductive wire pattern layer (not illustrated) may be made of aluminum, and a second conductive wire pattern layer (not illustrated) may be made of titanium. However, the present system and method are not limited thereto. If the first conductive wire pattern layer (not illustrated) is made of aluminum, hillocks may form depending on the temperature used in a subsequent process. If hillocks do form, the upper surface of the first conductive wire pattern layer may become uneven, resulting in a product with degraded optical characteristics. To prevent hillocks from forming, the second conductive wire pattern layer (not illustrated) made of titanium is formed on the first conductive wire pattern layer (not illustrated). Therefore, hillocks that may otherwise form due to a subsequent process are prevented.

The conductive wire pattern layer 120 may be formed using, but not limited to, a general sputtering method, a chemical vapor deposition (CVD) method, or an evaporation method.

For the alignment of a block copolymer 160 in a subsequent process, each of the first neutral layer 131 and the second neutral layer 132 may be made of a material that has similar surface energy as that of the block copolymer 160. For example, each of the first neutral layer 131 and the second neutral layer 132 may be, but is not limited to, a random copolymer of monomers of the block copolymer 160. The random copolymer may be, e.g., a cross-linkable random copolymer.

The guide pattern layer 140 may be a soft pattern layer made of photoresist or organic matter or a hard pattern layer made of metal or inorganic matter.

The etch-stop layer 150 may be made of a negative photoresist or positive photoresist.

Figure 2:
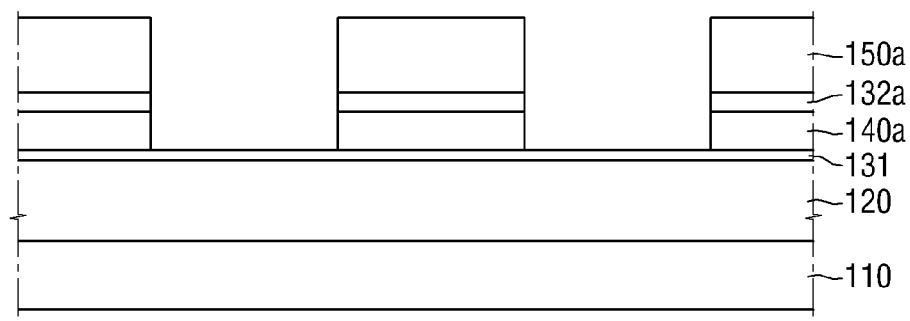
Figure 3:
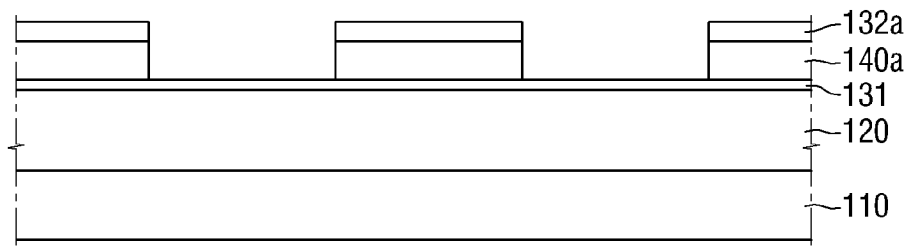

Referring to FIGS. 2 and 3, second neutral layer patterns 132a and guide patterns 140a may be formed. In an example, the etch-stop layer 150 may be exposed to light and developed using a mask to form etch-stop patterns 150a. Then, the second neutral layer 132 and the guide pattern layer 140 may be etched to form the second neutral layer patterns 132a and the guide patterns 140a.

In another example, the guide pattern layer 140 may be a polarity switchable photoresist. In such case, after the guide pattern layer 140 is coated, the polarity of the guide pattern layer 140 can be changed by a curing process. This allows portions of the guide pattern layer 140 corresponding to regions of the etch-stop layer 150 that are removed by a developing solution to also be removed. However, the guide pattern layer 140 has a tolerance to a solvent used to strip the etch-stop patterns 150a. Therefore, the guide patterns 140a may be formed.

In a more specific example, an acrylate-based polarity switchable photoresist may be coated to form the guide pattern layer 140 and then cured by light exposure or heat treatment. As a result, the acrylate-based polarity switchable photoresist of the guide pattern layer 140 can be developed in tetramethylammonium hydroxide (TMAH) but may have a tolerance to a general organic solvent. The material that forms the guide pattern layer 140 is not limited to the above example. Any polarity switchable photoresist material may be used.

Figure 4:
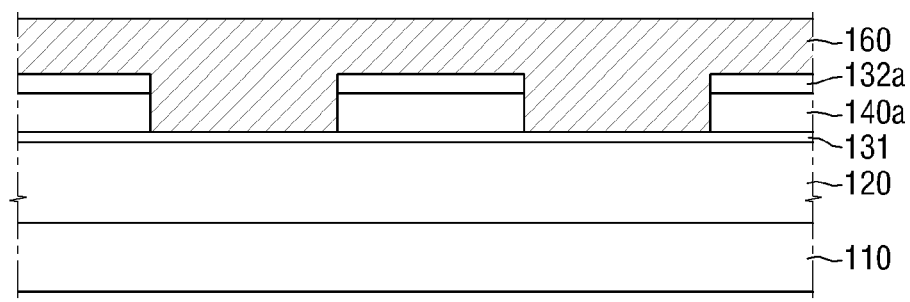

Referring to FIG. 4, the block copolymer 160 of two types of monomers having different etch rates may be formed on the first neutral layer 131 and the second neutral layer patterns 132a. The block copolymer 160 may be, but is not limited to, a polystyrene (PS)-polymethyl methacrylate (PMMA) block copolymer.

Figure 5:
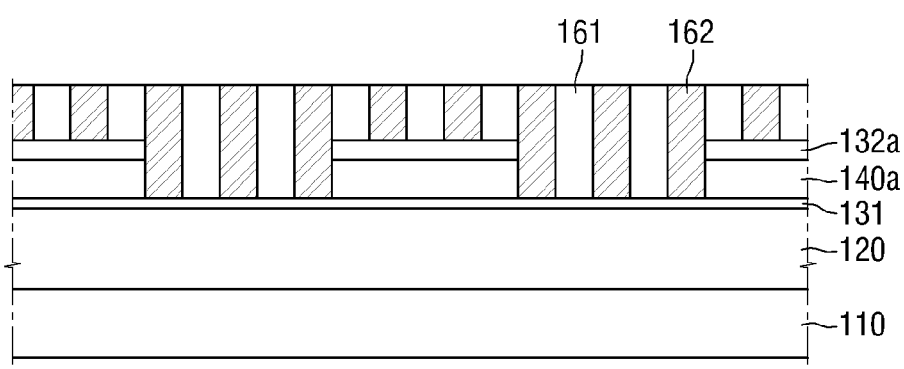

Referring to FIG. 5, the block copolymer 160 may be phase-separated into monomer blocks 161 and 162. The monomer blocks 161 and 162 of the block copolymer 160 may be made of hydrophilic and hydrophobic materials having different etch rates. Accordingly, the first neutral layer 131 and the second neutral layer patterns 132a may be formed on bottom portions of the monomer blocks 161 and 162, thus effectively aligning the block copolymer 160.

In one example, the side surfaces of the guide patterns 140a may have selectivity for any one of the monomer blocks 161 and 162. More specifically, the side surfaces of the guide patterns 140a may be hydrophilic or hydrophobic. This would allow the block copolymer 160 to be aligned more effectively.

The block copolymer 160 may be aligned by, but not limited to, thermal annealing or solvent annealing. Generally, solvent annealing, which is performed in a chamber including an evaporated solvent, has reduced alignment time compared with thermal annealing in which heat is applied. Whether solvent annealing or thermal annealing is used may be selected according to the layout of the entire process.

Figure 6:
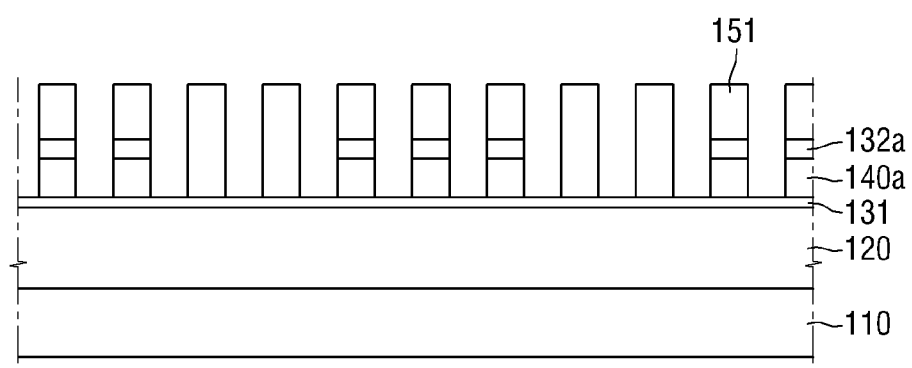

Referring to FIG. 6, the monomer blocks 162 having a relatively high etch rate may be removed. To remove the monomer blocks 162 having a relatively high etch rate, a conventional etching process may be used. For example, a dry etching process may be used, but the present system and method are not limited thereto. A gas for use in the above etching process may be, but is not limited to, one or more selected from the group consisting of 02, carbon fluoride gas, and hydrogen fluoride (HF). The carbon fluoride gas may be, but is not limited to, one or more selected from the group consisting of $C_4F_8$, $CHF_3$, $CH_2F_2$, $CF_4$ and $C_2F_6$.

Figure 7:
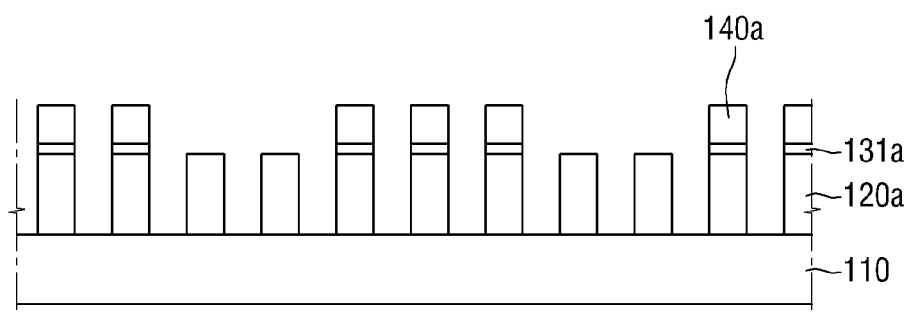

Referring to FIG. 7, the conductive wire pattern layer 120 may be etched using the monomer blocks 161 having a relatively low etch rate and the guide patterns 140a as a mask. Accordingly, a plurality of parallel conductive wire patterns 120a protruding from the substrate 110 may be formed.

The wire grid polarizer fabricated as described above includes the substrate 110, a plurality of parallel conductive wire patterns 120a protruding from the substrate 110, the first neutral layer patterns 131a, and the guide patterns 140a located on one or more of the conductive wire patterns 120a. For example, first neutral layer patterns 131a not exposed by the guide patterns 140a may be located on the conductive wire patterns 120a together with the guide patterns 140a, and first neutral layer 131 exposed between the guide patterns 140a may be removed by etching.

As FIG. 7 illustrates, the first neutral layer patterns 131a and the guide patterns 140a may be repeatedly arranged at intervals. Specifically, a plurality of pairs of the first neutral layer patterns 131a and the guide pattern 140a may be disposed adjacent to each other and may be repeatedly arranged between groups of one or more conductive wire patterns 120a without the first neutral layer patterns 131a and the guide patterns 140a thereon.

Figure 8:
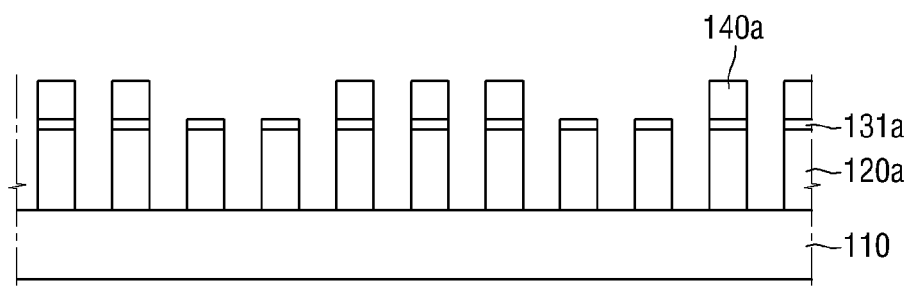
FIG. 8 is a vertical cross-sectional view of a wire grid polarizer according to another embodiment of the present system and method.

FIG. 8 is a vertical cross-sectional view of a wire grid polarizer according to another embodiment of the present system and method. Referring to FIG. 8, the wire grid polarizer includes a substrate 110, a plurality of parallel conductive wire patterns 120a protruding from the substrate 110, first neutral layer patterns 131a located on the conductive wire patterns 120a, and guide patterns 140a located on one or more of the first neutral layer patterns 131a.

The guide patterns 140a may be repeatedly arranged at intervals. Specifically, as FIG. 8 shows, the guide patterns 140a may be disposed adjacent to each other and may be repeatedly arranged between groups of one or more pairs of the conductive wire pattern 120a and the first neutral layer pattern 131a without the guide pattern 140a thereon.

The wire grid polarizer may be fabricated as a result of forming the first neutral layer patterns 131a by etching a first neutral layer 131 exposed between the guide patterns 140a. Although not illustrated in the drawing, in some cases, monomer blocks 161 having a relatively low etch rate may remain on first neutral layer patterns 131a without the guide patterns 140a thereon.

Figure 9:
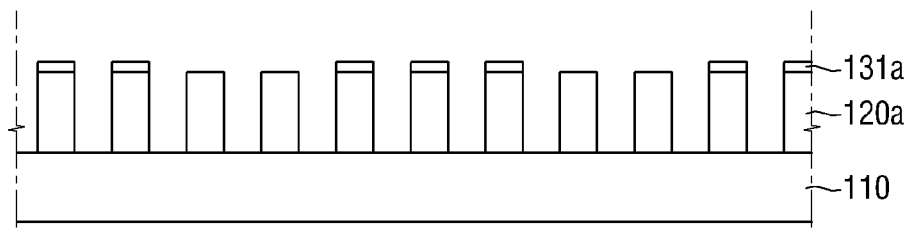
FIG. 9 is a vertical cross-sectional view of a wire grid polarizer according to another embodiment of the present system and method.

FIG. 9 is a vertical cross-sectional view of a wire grid polarizer according to another embodiment of the present system and method. Referring to FIG. 9, the wire grid polarizer includes a substrate 110, a plurality of parallel conductive wire patterns 120a protruding from the substrate 110, and first neutral layer patterns 131a located on one or more of the conductive wire patterns 120a.

In this case, the first neutral layer patterns 131a may be repeatedly arranged at intervals. Specifically, the first neutral layer patterns 131a may be disposed adjacent to each other and may be repeatedly arranged between groups of one or more conductive wire patterns 120a without the first neutral layer patterns 131a thereon.

The wire grid polarizer may be fabricated as a result of removing guide patterns 140a and portions of a first neutral layer 131 exposed between the guide patterns 140a using an etching process and leaving the first neutral layer patterns 131a not exposed by the guide patterns 140a on the conductive wire patterns 120a.

Figure 10:
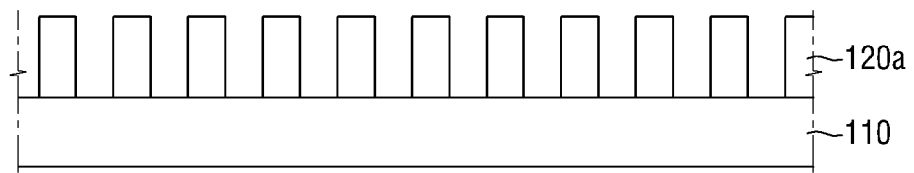
FIG. 10 is a vertical cross-sectional view of a wire grid polarizer according to another embodiment of the present system and method.

FIG. 10 is a vertical cross-sectional view of a wire grid polarizer according to another embodiment of the present system and method. Referring to FIG. 10, the wire grid polarizer includes a substrate 110 and a plurality of parallel conductive wire patterns 120a protruding from the substrate 110. In this case, first neutral layer patterns 131a, guide patterns 140a, and monomer blocks 161 having a relatively low etch rate may be removed from the conductive wire patterns 120a by a strip process. However, if the first neutral layer patterns 131a, the guide patterns 140a, and the monomer blocks 161 having a relatively low etch rate are removed by etching, the conductive wire patterns 120a may be damaged due to the difference in etch rates of these materials.

FIGS. 11 through 18 are cross-sectional views illustrating the steps of a process of fabricating a wire grid polarizer according to another embodiment of the present system and method.

Figure 11:
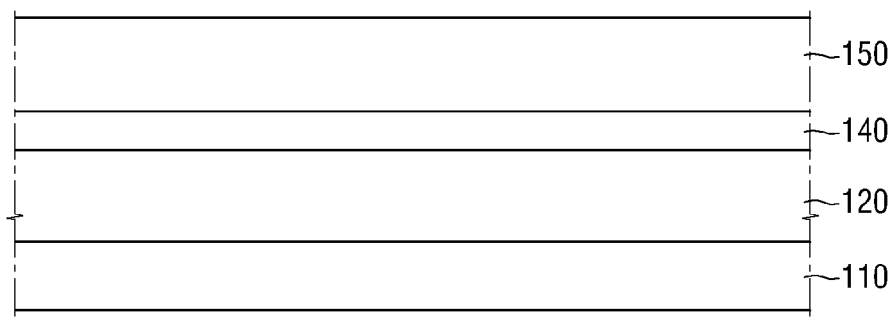
FIGS. 11, 12, 13, 14, 15, 16, 17 and 18 are cross-sectional views illustrating the steps of a process of fabricating a wire grid polarizer according to another embodiment of the present system and method.

Referring to FIG. 11, a conductive wire pattern layer 120, a guide pattern layer 140, and an etch-stop layer 150 may be sequentially stacked on a substrate 110. The conductive wire pattern layer 120, the guide pattern layer 140 and the etch-stop layer 150 stacked on the substrate 110 are identical to those described above with reference to FIG. 1, and thus a redundant description thereof is omitted.

Figure 12:
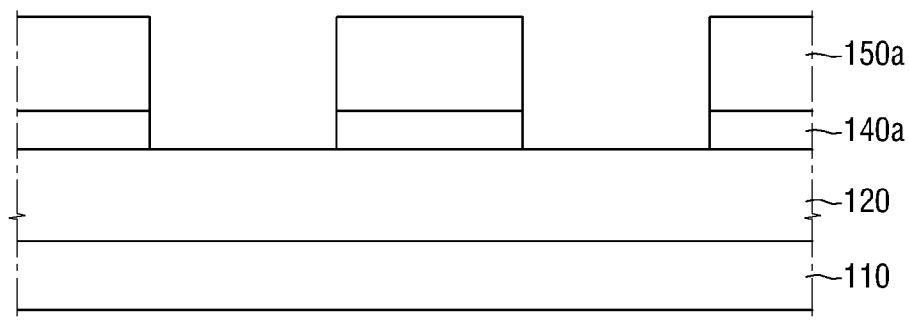
Figure 13:
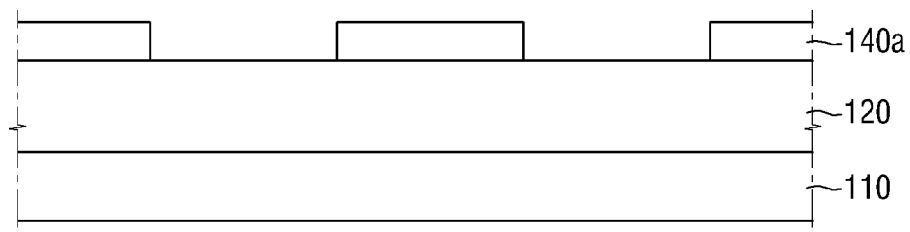

Referring to FIGS. 12 and 13, guide patterns 140a may be formed.

In one example, the etch-stop layer 150 may be exposed to light and developed using a mask to form etch-stop patterns 150a. Then, the guide pattern layer 140 may be etched to form the guide patterns 140a.

In another example, the guide pattern layer 140 may be a polarity switchable photoresist. In such case, after the guide pattern layer 140 is coated, the polarity of the coated guide pattern layer 140 may be changed by a curing process. This allows portions of the guide pattern layer 140 corresponding to regions of the etch-stop layer 150 that are removed by a developing solution to also be removed. However, the guide pattern layer 140 has a tolerance to a solvent used to strip the etch-stop patterns 150a. Therefore, the guide patterns 140a may be formed.

In a more specific example, an acrylate-based polarity switchable photoresist may be coated to form the guide pattern layer 140 and then cured by light exposure or heat treatment. As a result, the acrylate-based polarity switchable photoresist of the guide pattern layer 140 can be developed in TMAH but may have a tolerance to a general organic solvent. The material that forms the guide pattern layer 140 is not limited to the above example. Any polarity switchable photoresist material may be used.

Figure 14:
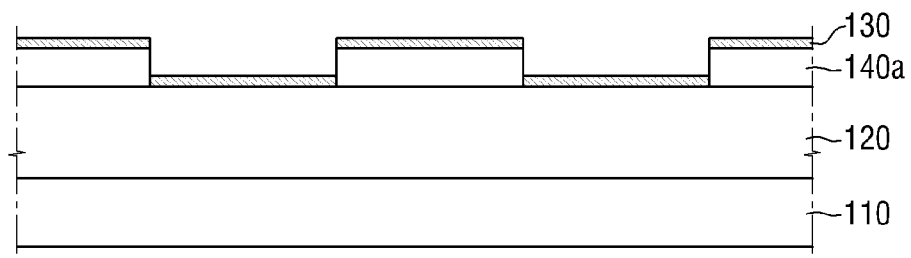

Referring to FIG. 14, a neutral layer 130 may be formed on the conductive wire pattern layer 120 and the guide patterns 140a. In this case, the neutral layer 130 may be coated only on the upper surface of the conductive wire pattern layer 120 and the upper surfaces of the guide patterns 140a. In some cases, after the neutral layer 130 is coated, it may be cross-linked.

The neutral layer 130 is identical or corresponds to the first and second neutral layers 131 and 132 described above with reference to FIG. 1, and thus a redundant description thereof is omitted.

Figure 15:
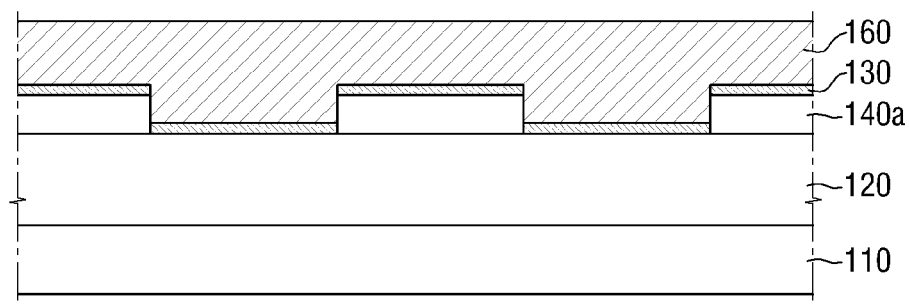

Referring to FIG. 15, a block copolymer 160 of two types of monomers having different etch rates may be formed on the entire neutral layer 130. Later, the block copolymer 160 may be phase-separated into monomer blocks 161 and 162.

The block copolymer 160 may be, but is not limited to, a polystyrene (PS)-polymethyl methacrylate (PMMA) block copolymer.

Figure 16:
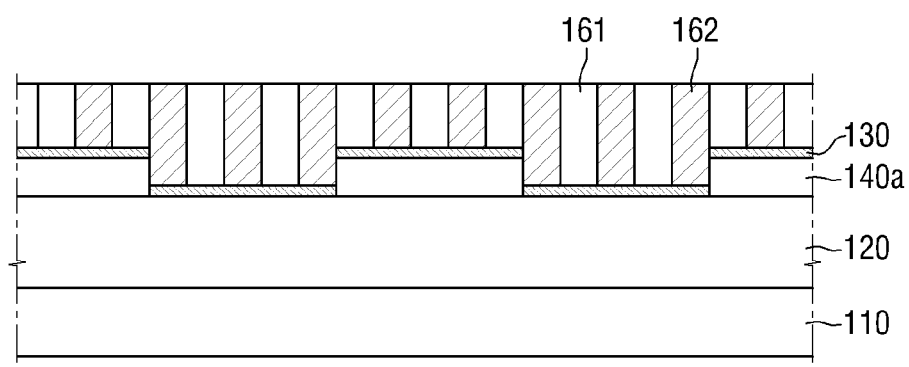

Referring to FIG. 16, the block copolymer 160 may be phase-separated into the monomer blocks 161 and 162. The monomer blocks 161 and 162 of the block copolymer 160 may be made of hydrophilic and hydrophobic materials having different etch rates. Accordingly, the neutral layer 130 may be formed on bottom portions of the monomer blocks 161 and 162, thus effectively aligning the block copolymer 160.

In one example, the side surfaces of the guide patterns 140a may have selectivity for any one of the monomer blocks 161 and 162. More specifically, the side surfaces of the guide patterns 140a may be hydrophilic or hydrophobic. This would allow the block copolymer 160 to be aligned more effectively.

The block copolymer 160 may be aligned by, but not limited to, thermal annealing or solvent annealing. Generally, solvent annealing, which is performed in a chamber including an evaporated solvent, has a reduced alignment time compared with thermal annealing in which heat is applied. Whether solvent annealing or thermal annealing is used may be selected according to the layout of the entire process.

Figure 17:
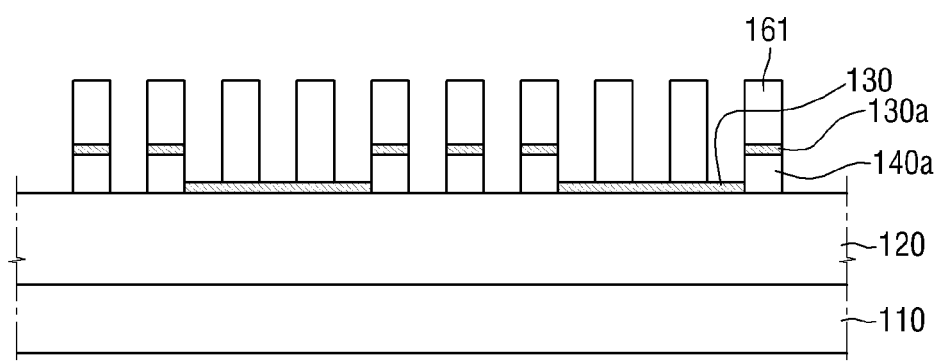

Referring to FIG. 17, the monomer blocks 162 having a relatively high etch rate may be removed. To remove the monomer blocks 162 having a relatively high etch rate, a conventional etching process may be used. For example, a dry etching process may be used, but the present system and method are not limited thereto. A gas for use in the above etching process may be, but is not limited to, one or more selected from the group consisting of 02, carbon fluoride gas, and hydrogen fluoride (HF). The carbon fluoride gas may be, but is not limited to, one or more selected from the group consisting of $C_4F_8$, $CHF_3$, $CH_2F_2$, $CF_4$ and $C_2F_6$.

Figure 18:
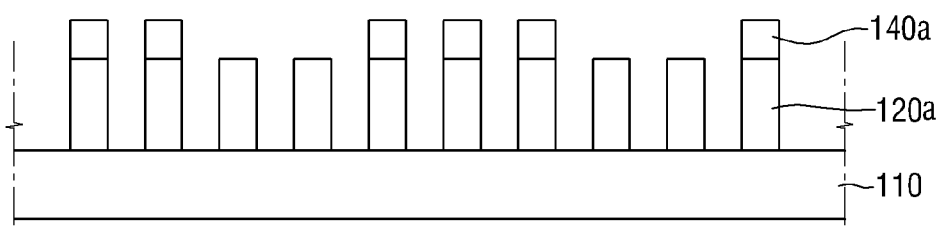

Referring to FIG. 18, the conductive wire pattern layer 120 may be etched using the monomer blocks 161 having a relatively low etch rate and the guide patterns 140a as a mask. Accordingly, a plurality of parallel conductive wire patterns 120a protruding from the substrate 110 may be formed.

The wire grid polarizer fabricated as described above includes the substrate 110, a plurality of parallel conductive wire patterns 120a protruding from the substrate 110, and the guide patterns 140a located on one or more of the conductive wire patterns 120a.

In this case, the guide patterns 140a may be repeatedly arranged at intervals. Specifically, the guide patterns 140a may be disposed adjacent to each other and may be repeatedly arranged between groups of one or more conductive wire patterns 120a without the guide patterns 140a thereon.

Figure 19:
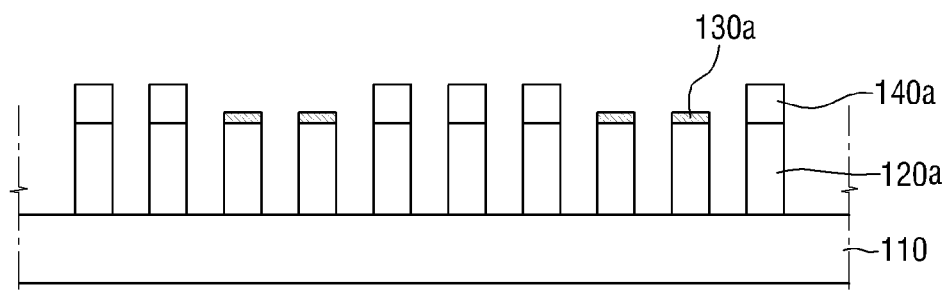
FIG. 19 is a vertical cross-sectional view of a wire grid polarizer according to another embodiment of the present system and method.

FIG. 19 is a vertical cross-sectional view of a wire grid polarizer according to another embodiment of the present system and method. Referring to FIG. 19, the wire grid polarizer includes a substrate 110, a plurality of parallel conductive wire patterns 120a protruding from the substrate 110, and neutral layer patterns 130a and guide patterns 140a located selectively on the conductive wire patterns 120a.

In this case, the neutral layer patterns 130a and the guide patterns 140a may be repeatedly arranged at intervals. Specifically, the guide patterns 140a may be disposed adjacent to each other and may be repeatedly arranged between groups of one or more neutral layer patterns 130a. In addition, the neutral layer patterns 130a may be disposed adjacent to each other and may be repeatedly arranged between groups of one or more guide patterns 140a.

The wire grid polarizer may be fabricated as a result of forming the neutral layer patterns 130a by etching a neutral layer 130 exposed between the guide patterns 140a. Although not illustrated in the drawing, in some cases, monomer blocks 161 having a relatively low etch rate may remain on the neutral layer patterns 130a.

The wire grid polarizer of the present system and method may be used in a display device. The display device may be, but is not limited to, a liquid crystal display (LCD), an organic light-emitting diode display (OLED), etc.

In this case, the wire grid polarizer may be used as an in-cell polarizer by forming a non-conductive protective layer on the conductive wire patterns 120a and then forming wiring and a thin-film transistor on the protective layer.

Embodiments of the present system and method provide at least one of the following advantages.

A wire grid polarizer having superior optical characteristics is provided.

However, the effects of the present system and method are not restricted to those discussed herein. The above and other effects of the present system and method will become more apparent to one of ordinary skill in the art to which the present system and method pertain.

What is claimed is:

1. A method of fabricating a wire grid polarizer, the method comprising:
   sequentially stacking a conductive wire pattern layer, a first neutral layer, a guide pattern layer and a second neutral layer on a substrate;
   forming etch-stop patterns on the second neutral layer;
   forming second neutral layer patterns and guide patterns by patterning the second neutral layer and the guide pattern layer using the etch-stop patterns;
   coating a block copolymer of two types of monomer blocks having different etch rates on the first neutral layer and the second neutral layer patterns;
   aligning the block copolymer;
   removing one type of monomer blocks from the aligned block copolymer; and
   patterning the conductive wire pattern layer using the remaining monomer blocks, the second neutral layer patterns, and the guide patterns.

2. The method of claim 1, wherein side surfaces of the guide patterns have selectivity for one of the two types of monomer blocks.

3. The method of claim 2, wherein the selectivity is hydrophilicity or hydrophobicity.

4. The method of claim 1, wherein the aligning of the block copolymer is performed by thermal annealing or solvent annealing.

5. The method of claim 1, wherein the guide pattern layer comprises a polarity switchable photoresist.

6. The method of claim 5, wherein the guide pattern layer is formed by a coating process and then a curing process.

7. A method of fabricating a wire grid polarizer, the method comprising:
   sequentially stacking a conductive wire pattern layer and a guide pattern layer on a substrate;
   forming guide patterns by patterning the guide pattern layer;
   forming a neutral layer on the guide patterns and the conductive wire pattern layer;
   coating a block copolymer of two types of monomer blocks having different etch rates on the neutral layer;
   aligning the block copolymer;
   removing one type of monomer blocks of from the aligned block copolymer; and
   patterning the conductive wire pattern layer using the remaining monomer blocks, the neutral layer, and the guide patterns.

8. The method of claim 7, wherein side surfaces of the guide patterns have selectivity for one of the two types of monomer blocks.

9. The method of claim 8, wherein the selectivity is hydrophilicity or hydrophobicity.

10. The method of claim 7, wherein the aligning of the block copolymer is performed by thermal annealing or solvent annealing.

11. The method of claim 7, wherein the guide pattern layer comprises a polarity switchable photoresist.

12. The method of claim 11, wherein the guide pattern layer is formed by a coating process and then a curing process.

* * * * *